US009795999B2

(12) United States Patent
Ootagaki et al.

(10) Patent No.: US 9,795,999 B2
(45) Date of Patent: Oct. 24, 2017

(54) SUBSTRATE PROCESSING APPARATUS AND SUBSTRATE PROCESSING METHOD

(71) Applicant: SHIBAURA MECHATRONICS CORPORATION, Yokohama-shi (JP)

(72) Inventors: Takashi Ootagaki, Yokohama (JP); Konosuke Hayashi, Yokohama (JP); Yosuke Himori, Yokohama (JP)

(73) Assignee: SHIBAURA MECHATRONICS CORPORATION, Yokohama-shi (JP)

(*) Notice: Subject to any disclaimer, the term of this patent is extended or adjusted under 35 U.S.C. 154(b) by 84 days.

(21) Appl. No.: 14/671,278

(22) Filed: Mar. 27, 2015

(65) Prior Publication Data
US 2015/0273534 A1 Oct. 1, 2015

(30) Foreign Application Priority Data

Mar. 27, 2014 (JP) ................. 2014-065610

(51) Int. Cl.
B08B 7/04 (2006.01)
B08B 3/08 (2006.01)
H01L 21/67 (2006.01)

(52) U.S. Cl.
CPC ............ B08B 3/08 (2013.01); H01L 21/6708 (2013.01); H01L 21/67051 (2013.01); H01L 21/67248 (2013.01)

(58) Field of Classification Search
CPC ........... H01L 21/67248; H01L 21/6708; H01L 21/67051
USPC .......................................................... 134/18
See application file for complete search history.

(56) References Cited

U.S. PATENT DOCUMENTS 6,588,437 B1 7/2003 Higashi
2008/0283515 A1 11/2008 Ookura et al.

FOREIGN PATENT DOCUMENTS

| JP | 2003-17461 | 1/2003 |
|----|------------|--------|
| JP | 2004-214449 A | 7/2004 |
| JP | 2009-231732 A | 10/2009 |
| JP | 2011-211092 A | 10/2011 |
| TW | 200842938 A | 11/2008 |
| TW | 201334055 A1 | 8/2013 |

OTHER PUBLICATIONS

Combined Taiwanese Office Action and Search Report issued on Jul. 13, 2016 in Patent Application No. 104109739 (with partial English language translation and English language translation of categories of cited documents).
Office Action dated Jun. 6, 2017 in corresponding Japanese Patent Application No. 2014-065610, with English translation.

Primary Examiner — Eric Golightly
(74) Attorney, Agent, or Firm — Oblon, McClelland, Maier & Neustadt, L.L.P.

(57) ABSTRACT

A substrate processing apparatus according to an embodiment includes: a liquid supplier configured to supply a processing liquid to a surface of a substrate; a temperature detector configured to detect a surface temperature of the substrate supplied with the processing liquid by the liquid supplier; a temperature monitor configured to determine whether or not the surface temperature detected by the temperature detector has reached a predetermined temperature; and a controller configured to cause the liquid supplier to stop supplying the processing liquid when the temperature monitor determines that the surface temperature has reached the predetermined temperature.

10 Claims, 3 Drawing Sheets

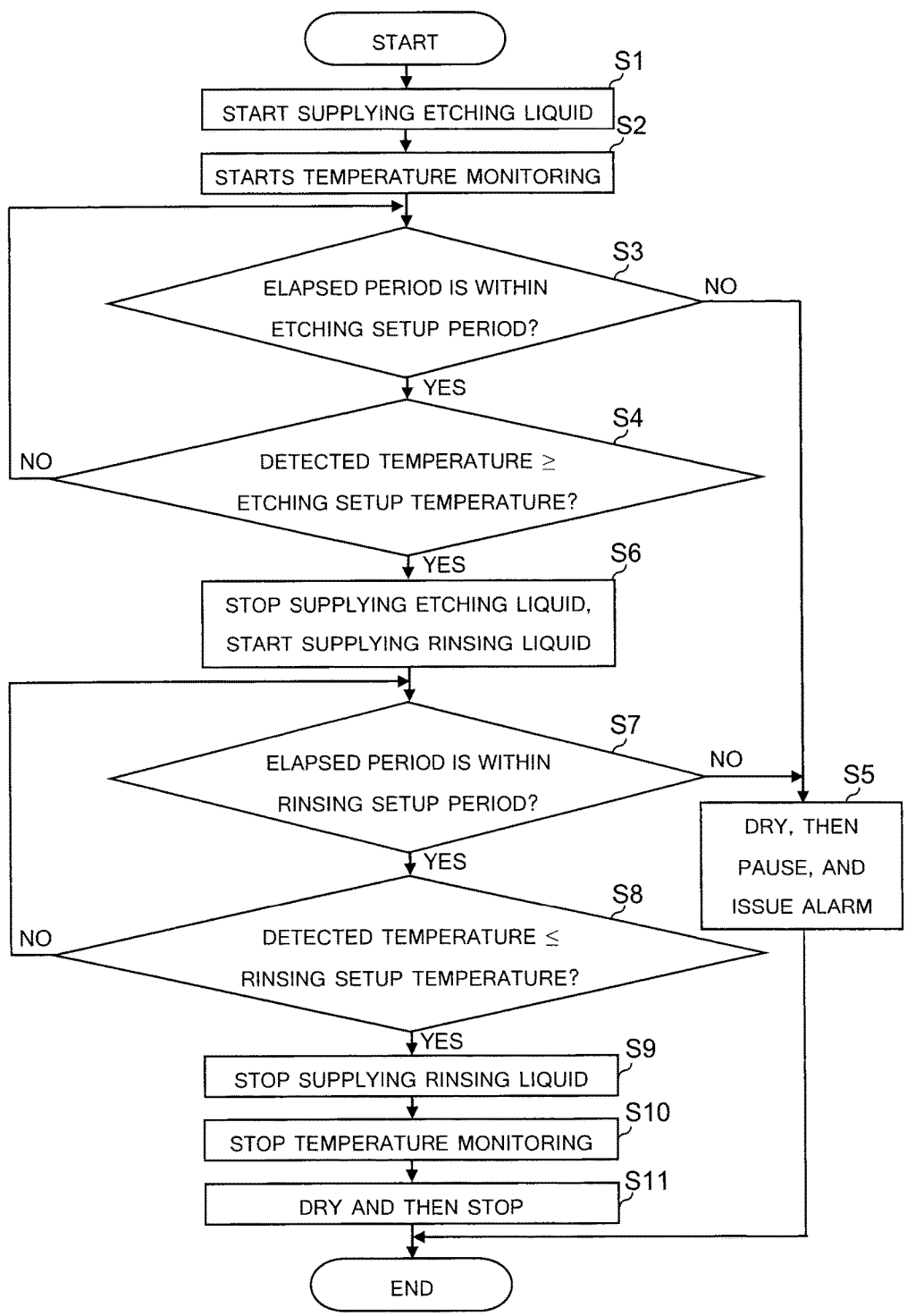

SUBSTRATE PROCESSING APPARATUS AND SUBSTRATE PROCESSING METHOD

CROSS-REFERENCE TO THE RELATED APPLICATION

This application is based on and claims the benefit of priority from Japanese Patent Application No. 2014-65610, filed on Mar. 27, 2014; the entire contents of which are incorporated herein by reference.

FIELD

Embodiments described herein relate generally to a substrate processing apparatus and a substrate processing method.

BACKGROUND

A substrate processing apparatus is an apparatus configured to process the surface of a substrate such as a wafer or a liquid crystal substrate by supplying the substrate surface with a processing liquid (for example, an etching liquid, a rinsing liquid, or the like) in a manufacturing step for semiconductor devices, liquid crystal panels, or the like. Among such substrate processing apparatuses, an apparatus has been developed which is configured to perform a spinning process by supplying approximately the center of a substrate surface with a processing liquid from a nozzle while the substrate is being rotated horizontally, so that a centrifugal force of the rotation spreads the processing liquid over the substrate surface.

However, in the above-described substrate processing apparatus, if the processing liquid is discharged incompletely from the substrate surface, the processing liquid remaining on the substrate surface degrades the process uniformity (for example, process uniformity of an etching process, a rinsing process, or the like) on the substrate surface, or leaves stains such as smear or spot, thereby causing a process failure. Meanwhile, a processing liquid is excessively supplied in some cases, and consequently a large amount of the processing liquid is consumed. Hence, reductions in process failures and processing liquid consumption are demanded.

BRIEF DESCRIPTION OF THE DRAWINGS

FIG. 3 is a flowchart for illustrating a substrate processing flow according to the embodiment.

DETAILED DESCRIPTION

According to one embodiment, a substrate processing apparatus includes: a liquid supplier configured to supply a processing liquid to a surface of a substrate; a temperature detector configured to detect a surface temperature of the substrate supplied with the processing liquid by the liquid supplier; a temperature monitor configured to determine whether or not the surface temperature detected by the temperature detector has reached a predetermined temperature; and a controller configured to cause the liquid supplier to stop supplying the processing liquid when the temperature monitor determines that the surface temperature has reached the predetermined temperature.

According to another embodiment, a substrate processing method includes the steps of: supplying a processing liquid to a surface of a substrate; detecting a surface temperature of the substrate supplied with the processing liquid; determining whether or not the detected surface temperature has reached a predetermined temperature; and stopping supplying the processing liquid when it is determined that the surface temperature had reached the predetermined temperature.

An embodiment will be described with reference to the drawings.

Figure 1:
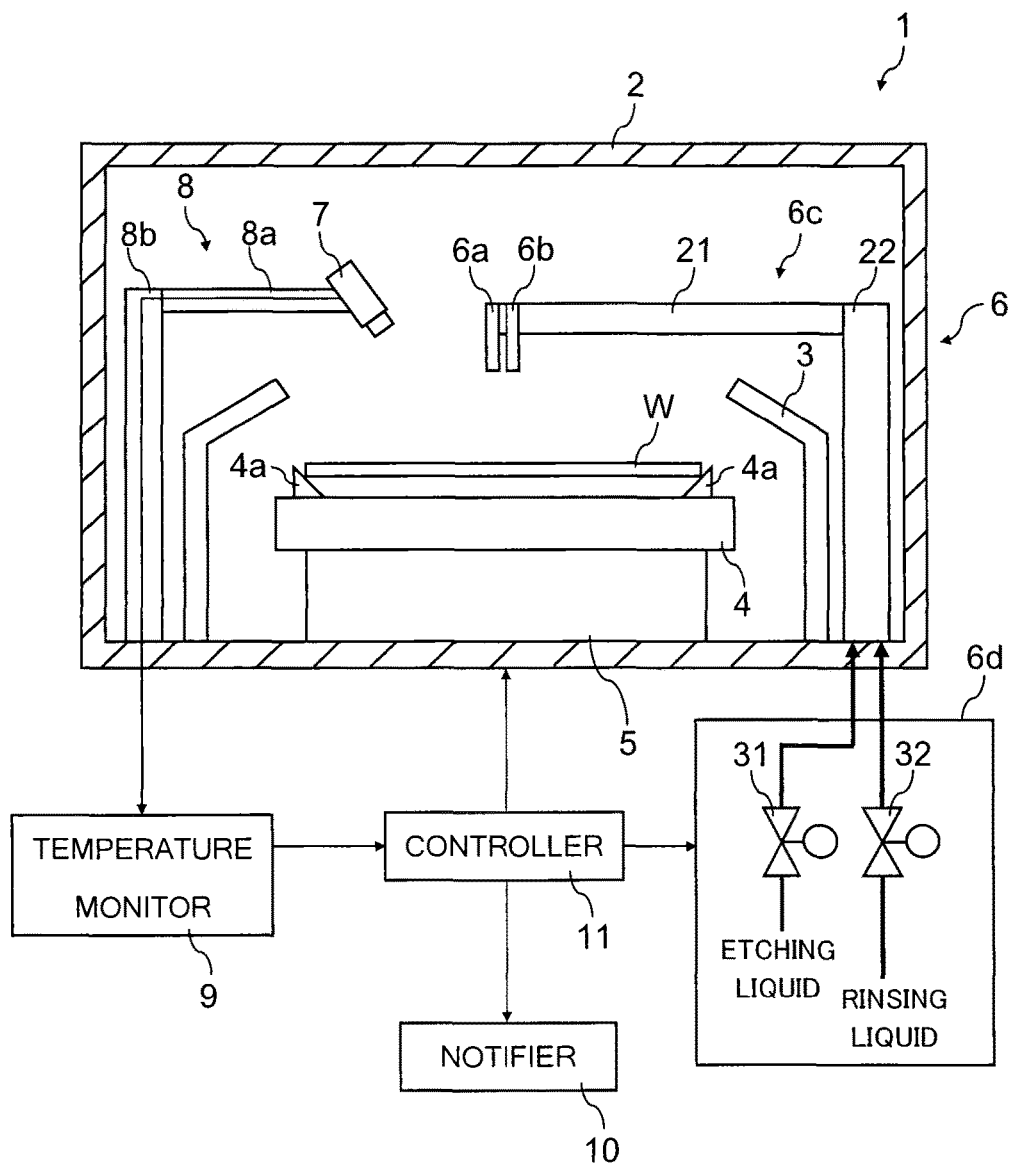
FIG. 1 is a view showing a schematic configuration of a substrate processing apparatus according to an embodiment.

As shown in FIG. 1, a substrate processing apparatus 1 according to the embodiment includes: a processing box 2 as a processing chamber; a cup 3 provided within the processing box 2; a supporter 4 configured to support a substrate W horizontally within the cup 3; a rotation mechanism 5 configured to rotate the supporter 4 in a horizontal plane; a liquid supplier 6 configured to supply a processing liquid to the surface of the substrate W on the supporter 4; a temperature detector 7 configured to detect a surface temperature of the substrate W when a processing liquid is supplied; a support mechanism 8 configured to support the temperature detector 7; a temperature monitor 9 configured to monitor the temperature of the substrate W when a processing liquid is supplied; a notifier 10 configured to provide notice of a process failure; and a controller 11 configured to control each unit.

The cup 3 is formed into a cylindrical shape, and houses the supporter 4 by surrounding the supporter 4 from the periphery thereof. The cup 3 has a peripheral wall whose upper portion inclines inwardly in a radial direction, and has an opening from which the substrate W on the supporter 4 exposed. The cup 3 is configured to receive a processing liquid flowing down from the top of the rotating substrate W and a processing liquid scattered therefrom. Note that the cup 3 has a bottom portion connected to a discharge pipe (not shown) configured to discharge the processing liquids thus received.

The supporter 4 is positioned at approximately the center within the cup 3, and provided rotatably in the horizontal plane. The supporter 4 has multiple support members 4a such as pins. These support members 4a are configured to detachably hold the substrate W such as a wafer or a liquid crystal substrate.

The rotation mechanism 5 has a rotation shaft connected to the supporter 4, a motor configured to rotate the rotation shaft (none are shown), and the like. The rotation mechanism 5 is driven by the motor to rotate the supporter 4 utilizing the rotation shaft. The rotation mechanism 5 is electrically connected to the controller 11, and the controller 11 controls the driving.

The liquid supplier 6 includes: multiple nozzles 6a and 6b each configured to supply a processing liquid to the surface of the substrate W on the supporter 4; a movement mechanism 6c configured to move these nozzles 6a and 6b along the surface of the substrate W on the supporter 4; and a liquid provider 6d configured to provide a processing liquid to each of the nozzles 6a and 6b.

The nozzles 6a and 6b are provided above the surface of the substrate W on the supporter 4 and located near the center of the surface. The first nozzle 6a is configured to eject an etching liquid toward the surface of the substrate W on the supporter 4 from a position above the surface during rotation, the etching liquid being provided from the liquid provider 6d. Moreover, the second nozzle 6b is configured to eject a rinsing liquid toward the surface of the substrate W on the supporter 4 from a position above the surface during rotation, the rinsing liquid being provided from the liquid provider 6d.

Incidentally, the number of the nozzles is two in FIG. 1, but the number is merely an example and is not particularly limited. Additionally, each of the nozzles provided corresponds to one type of processing liquids, but the configuration is not limited thereto. Multiple nozzles such as two nozzles may be provided to one type of processing liquids, and the number is not particularly limited.

The movement mechanism 6c is constituted of an arm 21 configured to hold the nozzles 6a and 6b, and a column 22 configured to support one end portion of the arm 21 rotatably in the horizontal plane. The arm 21 is configured to rotate about the column 22 and along the surface of the substrate W on the supporter 4, so that the nozzles 6a and 6b supported by the arm 21 also move along the surface of the substrate W. For example, the movement mechanism 6c moves the nozzles 6a and 6b to a processing position which faces approximately the center of the surface of the substrate W on the supporter 4, and a standby position which enables loading and unloading of the substrate W onto and from the supporter 4 with the movement mechanism 6c retreated from the processing position. The movement mechanism 6c is electrically connected to the controller 11, and the controller 11 controls the driving.

The liquid provider 6d includes valves 31 and 32 as regulation valves configured to regulate flow amounts, a tank configured to store a processing liquid, a pump as a driving source (none are shown), and the like. The liquid provider 6d opens the valves 31 and 32, and provides the nozzles 6a and 6b with processing liquids (etching liquid and rinsing liquid) by the driving of the pump. The liquid provider 6d is electrically connected to the controller 11, and the controller 11 controls the driving. Hence, the controller 11 controls the size of an opening of each of the valves 31 and 32.

Note that, as the etching processing liquid, various chemical solutions including, for example, hydrofluoric acid, nitric acid, and the like can be used; as the rinsing liquid, various liquids such as, for example, pure water and ultrapure water can be used.

The temperature detector 7 is a detector (for example, heat detector) configured to detect the surface temperature of the substrate W, and provided at a position above the surface of the substrate W on the supporter 4 at which the surface temperature can be detected. The temperature detector 7 is electrically connected to the temperature monitor 9, and transmits the detected surface temperature of the substrate W to the temperature monitor 9. As the temperature detector 7, it is possible to use a thermograph configured to detect a surface temperature distribution on the substrate W; further, multiple non-contact thermometers (for example, non-contact infrared thermometers), contact thermometers, and the like can also be used instead of such a thermograph. Incidentally, in a case where it is not necessary to detect a surface temperature distribution on the substrate W, only one non-contact thermometer or contact thermometer can be used as the temperature detector 7 (the details will be described later).

Figure 2:
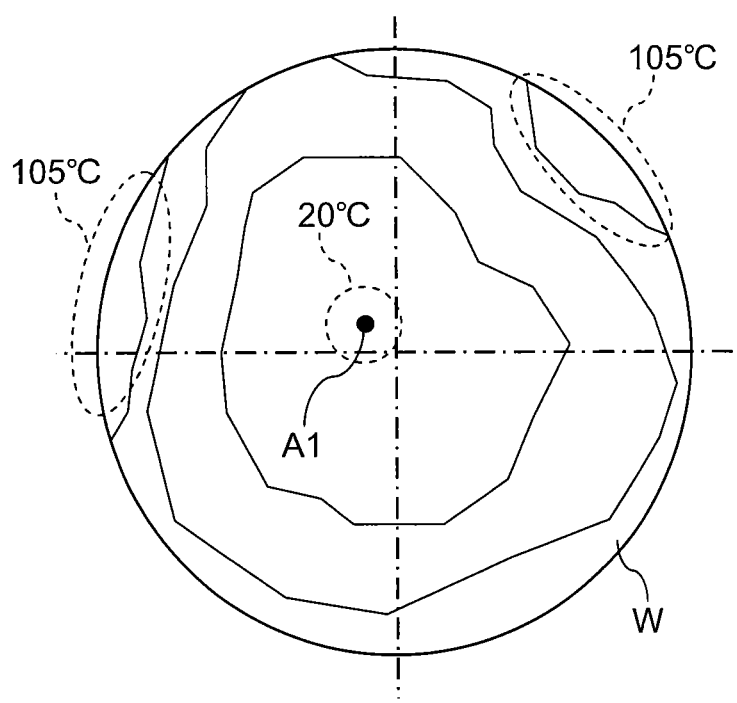
FIG. 2 is an explanatory view for explaining a surface temperature distribution on a substrate when a rinsing liquid is supplied according to the embodiment.

The temperature detector 7 is configured to detect a surface temperature distribution on the substrate W as shown in FIG. 2, for example. The temperature distribution is a temperature distribution immediately after a rinsing liquid at normal temperature (for example, 20° C.) is supplied onto the surface of the substrate W. Subsequently, if the rinsing liquid is continuously supplied, the surface temperature distribution on the substrate W is gradually made uniform at the temperature of the rinsing liquid (i.e., normal temperature). In this event, a supply position (supply point) A1 on the surface of the substrate W to which the rinsing liquid is supplied from the nozzle 6b is located at approximately the center (near the center) of the substrate W. The surface temperature around the supply position A1 on the substrate W is approximately 20° C., whereas the temperature at a portion of the outermost peripheral portion (the outermost edge portion) of the substrate W is 105° C. The position having a temperature of 105° C. is a position where the temperature is increased due to the reaction heat of an etching liquid having remained from the pretreatment of the etching process, in other words, a position where the etching process progresses due to insufficient rinsing process using a rinsing liquid, for example, insufficient supply of a rinsing liquid.

Again in FIG. 1, the support mechanism 8 is constituted of an arm 8a configured to hold the temperature detector 7, and a column 8b configured to support the arm 8a. The arm 8a and the column 8b are provided at such positions that the arm 8a and the column 8b do not interrupt supplying processing liquids from the nozzles 6a and 6b. The arm 8a and the column 8b are configured to hold the temperature detector 7, enabling the detection of a surface temperature of the substrate W on the supporter 4. Note that for a case where the arm 8a hinders the loading and unloading of the substrate W, a swing mechanism configured to swing the arm 8a may be provided so that when the substrate W is loaded or unloaded, the swing mechanism can move the arm 8a to prevent the hindrance.

The temperature monitor 9 is configured to monitor the surface temperature of the substrate W detected by the temperature detector 7 during a substrate processing such as an etching process or a rinsing process, and as necessary to transmit the monitoring result to the controller 11. For example, during an etching process or a rinsing process, the temperature monitor 9 determines whether or not the surface temperature of the substrate W has reached predetermined etching setup temperature or rinsing setup temperature, and transmits the determination result to the controller 11. In the determination during an etching process, the temperature monitor 9 uses the lowest temperature in the surface temperature distribution as the surface temperature of the substrate W to determine whether or not the lowest temperature has reached a predetermined etching setup temperature (for example, 100° C.). On the other hand, in the determination during a rinsing process, the temperature monitor 9 uses the highest temperature in the surface temperature distribution as the surface temperature of the substrate W to determine whether or not the highest temperature has reached a predetermined rinsing setup temperature (for example, 20° C.)

Note that, as the temperature used in the above-described determinations, an average value of the surface temperature distribution on the substrate W may be obtained and used instead of using the lowest temperature or the highest temperature in the surface temperature distribution on the substrate W. Further, in a case where a position on the surface of the substrate W where a substrate processing such as an etching process or a rinsing process is insufficient (for example, a portion of the outermost peripheral portion of the substrate W) has been revealed by experiments, experiences, or the like, a non-contact thermometer or a contact thermometer may be provided as the temperature detector 7 to detect the surface temperature at the position so that the detected surface temperature can be used for the above-described determinations. Furthermore, in a case where there are multiple positions where a substrate processing is insufficient, multiple non-contact thermometers or contact thermometers may be provided to detect the surface temperatures at these positions so that the highest temperature or the lowest temperature among the detected multiple surface temperatures can be used or an average value of these surface temperatures may be used.

The notifier 10 is configured to notify the user of a process failure if an etching process or a rinsing process fails. As the notifier 10, it is possible to use, for example, an alarm such as lamps and buzzers, a display configured to display letters, an audio output unit configured to output an audio sound, and the like.

The controller 11 includes a microcomputer configured to intensively control each unit, and a storage configured to store substrate processing information on substrate processing, various programs, and the like (none are shown). The controller 11 is configured to control the rotation mechanism 5, the liquid supplier 6, and the like based on the substrate processing information and various programs, and perform control such that a processing liquid (etching liquid or rinsing liquid) provided from the liquid provider 6d is supplied from one of the nozzles 6a and 6b to the surface of the substrate W on the supporter 4 during rotation.

Next, a substrate processing flow executed by the above-described substrate processing apparatus 1 will be described with reference to FIG. 3.

As shown in FIG. 3, in an etching process, the nozzle 6a starts supplying an etching liquid to the surface of the substrate W on the supporter 4 during rotation (step S1), and the temperature monitor 9 starts monitoring the temperature of the surface of the substrate W (step S2). Note that although the temperature detector 7 constantly detects the surface temperature of the substrate W, monitoring the detected temperature is started from the temperature monitoring in step S2.

After supplying an etching liquid is started in step S1, the etching liquid supplied from the nozzle 6a to approximately the center of the substrate flows to a peripheral edge portion of the substrate by a centrifugal force. Thereby, the surface of the substrate W is covered with the etching liquid during the etching process. The surface temperature of the substrate W in this event is detected by the temperature detector 7, and inputted to the temperature monitor 9.

After step S2, the controller 11 determines whether or not a period elapsed from the start of supplying the etching liquid is within a predetermined etching setup period (for example, several minutes) (step S3). If it is determined that the elapsed period is within the predetermined etching setup period (YES in step S3), the temperature monitor 9 determines whether or not the detected temperature is equal to or higher than a predetermined etching setup temperature (for example, 100° C.) (step S4). Note that the etching setup period is a processing setup period during an etching process, and is set by the user in advance.

In step S4, if it is determined that the detected temperature is not equal to or higher than the predetermined etching setup temperature (NO in step S4), the etching process is continued, and the processing flow returns to step S3. In step S3, if it is determined that the elapsed period is not within the predetermined etching setup period, that is, the etching process has ended (NO in step S3), the controller 11 stops the rotation of the substrate W after the substrate is dried by shake-off drying or the like. Since the detected temperature has not reached the predetermined etching setup temperature or higher within the predetermined etching setup period (i.e., the etching liquid is not sufficiently distributed all over the surface of the substrate W), the notifier 10 issues a warning that the etching process fails (step S5).

Herein, in step S4, the lowest temperature in the surface temperature distribution is used as the detected temperature monitored by the temperature monitor 9, and whether or not the lowest temperature is equal to or higher than the predetermined etching setup temperature is determined. This determination makes it possible to grasp the timing of the etching process completion. To be more specific, the lowest temperature being equal to or higher than the predetermined etching setup temperature indicates the following: the etching liquid is sufficiently distributed all over the surface of the substrate W; a sufficient reaction (reaction heat) occurs all over the surface of the substrate W; the entire surface is uniformly processed; and the etching process is completed all over the surface of the substrate W.

In step S4, if it is determined that the detected temperature is equal to or higher than the predetermined etching setup temperature (YES in step S4), the processing is switched from the etching process to a rinsing process. In other words, supplying the etching liquid is stopped by the controller 11, and supplying a rinsing liquid is started (step S6).

After supplying a rinsing liquid is started in step S6, the rinsing liquid supplied from the nozzle 6b to approximately the center of the substrate flows to the peripheral edge portion of the substrate by a centrifugal force. Thereby, the surface of the substrate W is covered with the rinsing liquid during the rinsing process. The surface temperature of the substrate W in this event is detected by the temperature detector 7, and inputted to the temperature monitor 9.

After step S6, the controller 11 determines whether or not a period elapsed from the start of supplying the rinsing liquid is within a predetermined rinsing setup period (for example, 30 seconds) (step S7). If it is determined that the elapsed period is within the predetermined rinsing setup period (YES in step S7), the temperature monitor 9 determines whether or not the detected temperature is equal to or lower than a predetermined rinsing setup temperature (for example, 20° C.) (step S8). Note that the rinsing setup period is a processing setup period during a rinsing process, and is set by the user in advance.

In step S8, if it is determined that the detected temperature is not equal to or lower than the predetermined rinsing setup temperature (NO in step S8), the rinsing process is continued, and the processing flow returns to step S7. In step S7, if it is determined that the elapsed period is not within the predetermined rinsing setup period, that is, the rinsing process has ended (NO in step S7), the controller 11 stops the rotation of the substrate W after the substrate is dried by shake-off drying or the like. Since the detected temperature has not reached the predetermined rinsing setup temperature or lower within the predetermined rinsing setup period (i.e., the rinsing liquid is not sufficiently distributed all over the surface of the substrate W), the notifier 10 issues a warning that the rinsing process fails (step S5).

Herein, in step S8, the highest temperature in the surface temperature distribution is used as the detected temperature monitored by the temperature monitor 9, and whether or not the highest temperature is equal to or lower than the predetermined rinsing setup temperature is determined. This determination makes it possible to grasp the timing of the rinsing process completion. To be more specific, the highest temperature being equal to or lower than the predetermined rinsing setup temperature indicates the following: the rinsing liquid is sufficiently distributed all over the surface of the substrate W; the entire surface is uniformly processed; and the rinsing process is completed all over the surface of the substrate W.

In step S8, if it is determined that the detected temperature is equal to or lower than the predetermined rinsing setup temperature (YES in step S8), the rinsing process has ended, in other words, supplying the rinsing liquid is stopped by the controller 11 (step S9). Further, the temperature monitoring by the temperature monitor 9 is stopped (step S10). The controller 11 stops the rotation of the substrate W after the substrate is dried by shake-off drying or the like (step S11).

According to such a substrate processing, during the etching process, supplying the etching liquid to the surface of the substrate W is stopped in accordance with the surface temperature of the substrate W. Moreover, during the rinsing process also, supplying the rinsing liquid to the surface of the substrate W is stopped in accordance with the surface temperature of the substrate W. Hence, the process completion timings of the etching process and the rinsing process are optimized, and appropriate amounts of the processing liquids required for the processes are supplied onto the surface of the substrate W.

Specifically, in the etching process, an appropriate amount of the etching liquid is distributed all over the surface of the substrate W, a sufficient reaction (reaction heat) occurs all over the surface of the substrate W, and thus the entire surface of the substrate W is uniformly processed. This makes it possible to reduce degradation of the etching process uniformity on the substrate W, and also formation of stains such as smear or spot, which would otherwise occur due to shortage of the etching liquid, the residue thereof, or the like. In addition, since the etching liquid is supplied in an appropriate amount, it is possible to reduce the amount of the etching liquid consumed.

Moreover, in the rinsing process, an appropriate amount of the rinsing liquid is distributed all over the surface of the substrate W, and thus the entire surface of the substrate W is uniformly processed. This makes it possible to reduce degradation of the rinsing process uniformity on the substrate W, and also formation of stains such as smear or spot, which would otherwise occur due to shortage of the rinsing liquid or the residue of the etching liquid in the pretreatment. In addition, since the rinsing liquid is supplied in an appropriate amount, it is possible to reduce the amount of the rinsing liquid consumed.

Further, in the etching process and the rinsing process as described above, if the processes fail, the user is notified of the process failures. Accordingly, the user can grasp the process failures. Thus, it is no longer necessary for the user to inspect the product to see if the processes fail. Hence, the user convenience is improved, and furthermore a reduction in the inspection period and an improvement in the inspection precision are achieved.

As has been described above, according to the embodiment, the surface temperature of the substrate W supplied with a processing liquid (for example, etching liquid or rinsing liquid) by the nozzle 6a or 6b is detected. If the detected surface temperature has reached the predetermined temperature, supplying the processing liquid from the nozzle 6a or 6b is stopped. Thereby, the processes are completed at appropriate timings, and appropriate amounts of the processing liquids required for the processings are supplied onto the surface of the substrate W. This makes it possible to reduce degradation of the process uniformity on the surface of the substrate W, or formation of stains such as smear or spot, which would otherwise occur due to shortage of the processing liquids or the residue. Furthermore, since the processing liquids are not excessively supplied, it is possible to suppress an increase in the amounts of the processing liquids consumed. In this manner, reductions in process failures and processing liquid consumption are achieved.

OTHER EMBODIMENTS

In the above-described embodiment, the substrate W is processed step by step. Nevertheless, the configuration is not limited thereto. Batch processing may be executed. In the batch processing, various temperature detectors 7 can be used. In a case where substrates W are aligned at short intervals as if the substrates W overlap each other, it is desirable to use a contact thermometer as the temperature detector 7, and to provide the contact thermometer directly on the surface of each of the substrates W. Note that, during the batch processing, a storage tank (storage) configured to store a processing liquid for immersing the substrate W functions as the liquid supplier configured to supply the processing liquid to the surface of the substrate W. Additionally, in stopping supplying the processing liquid to the surface of the substrate W, a substrate-take-out mechanism is controlled in such a manner as to take out the substrate W from the storage tank, or a discharge valve is controlled in such a manner as to discharge the processing liquid inside the storage tank.

Further, in the above-described embodiment, although the movement mechanism 6c does not move the nozzles 6a and 6b during the processes, the configuration is not limited thereto. For example, the movement mechanism 6c may move the nozzles 6a and 6b during the processes in accordance with the surface temperature of the substrate W. As an example, during the etching process, the nozzle 6a is moved to face a position having the lowest surface temperature in comparison with the other positions on the substrate W; in addition, during the rinsing process, the nozzle 6b is moved to face a position having the highest surface temperature in comparison with the other positions of the substrate W. In such a case, it is possible to shorten the processing periods of the etching process and the rinsing process. Accordingly, a further reduction in processing liquid consumptions is achieved together with a reduction in process failures.

Moreover, in the above-described embodiment, if the detected temperature has not reached the predetermined setup temperature within the predetermined setup period, the etching process or the rinsing process is stopped, and the warning is issued. Nevertheless, the configuration is not limited thereto. For example, a process may be continued until the detected temperature has reached the setup temperature without issuing the warning.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate processing apparatus comprising:
   a liquid supplier configured to supply a processing liquid to a surface of a substrate;

a temperature detector configured to detect a surface temperature of the substrate during supply of the processing liquid by the liquid supplier;

a temperature monitor configured to determine whether or not the surface temperature detected by the temperature detector has reached a predetermined temperature; and a controller configured to cause the liquid supplier to stop supplying the processing liquid when the temperature monitor determines that the surface temperature has reached the predetermined temperature, wherein when the processing liquid is an etching liquid, the temperature monitor uses a lowest temperature in a surface temperature distribution as the surface temperature of the substrate to determine whether or not the surface temperature detected by the temperature detector has reached the predetermined temperature, or when the processing liquid is a rinsing liquid, the temperature monitor uses a highest temperature in the surface temperature distribution as the surface temperature of the substrate to determine whether or not the surface temperature detected by the temperature detector has reached the predetermined temperature.

2. The substrate processing apparatus according to claim 1, wherein
the liquid supplier supplies each of an etching liquid and a rinsing liquid as the processing liquid,
the temperature detector detects the surface temperature of the substrate during supply of the etching liquid by the liquid supplier, and
when the temperature monitor determines that the surface temperature has reached the predetermined temperature, the controller causes the liquid supplier to stop supplying the etching liquid and then to start supplying the rinsing liquid.

3. The substrate processing apparatus according to claim 1, wherein
the liquid supplier has a nozzle configured to supply the processing liquid to the surface of the substrate,
the temperature detector detects a surface temperature distribution on the substrate, and
the substrate processing apparatus further comprises a movement mechanism configured to move the nozzle, in accordance with the surface temperature distribution detected by the temperature detector, in such a manner as to change a supply position of the processing liquid on the substrate.

4. The substrate processing apparatus according to claim 2, wherein
the liquid supplier has a nozzle configured to supply the processing liquid to the surface of the substrate,
the temperature detector detects a surface temperature distribution on the substrate, and
the substrate processing apparatus further comprises a movement mechanism configured to move the nozzle, in accordance with the surface temperature distribution detected by the temperature detector, in such a manner as to change a supply position of the processing liquid on the substrate.

5. The substrate processing apparatus according to claim 1, further comprising a notifier configured to provide notice of a process failure in a case where the temperature monitor determines that the surface temperature has not reached the predetermined temperature, when a predetermined processing setup period elapses after supplying the processing liquid is started.

6. The substrate processing apparatus according to claim 2, further comprising a notifier configured to provide notice of a process failure in a case where the temperature monitor determines that the surface temperature has not reached the predetermined temperature, when a predetermined processing setup period elapses after supplying the processing liquid is started.

7. The substrate processing apparatus according to claim 3, further comprising a notifier configured to provide notice of a process failure in a case where the temperature monitor determines that the surface temperature has not reached the predetermined temperature, when a predetermined processing setup period elapses after supplying the processing liquid is started.

8. The substrate processing apparatus according to claim 4, further comprising a notifier configured to provide notice of a process failure in a case where the temperature monitor determines that the surface temperature has not reached the predetermined temperature, when a predetermined processing setup period elapses after supplying the processing liquid is started.

9. The substrate processing apparatus according to claim 1, wherein
the processing liquid is an etching liquid.

10. The substrate processing apparatus according to claim 1, wherein
the processing liquid is a rinsing liquid.

* * * * *